United States Patent [19]

Kashiwagi

[11] Patent Number: 5,003,370
[45] Date of Patent: Mar. 26, 1991

[54] HIGH POWER FREQUENCY SEMICONDUCTOR DEVICE WITH IMPROVED THERMAL RESISTANCE

[75] Inventor: Shunji Kashiwagi, Yokohama, Japan

[73] Assignee: Fujitsu Limited, Kawasaki, Japan

[21] Appl. No.: 546,659

[22] Filed: Jul. 3, 1990

Related U.S. Application Data

[63] Continuation of Ser. No. 134,604, Dec. 14, 1987, abandoned, which is a continuation of Ser. No. 860,682, Apr. 30, 1986, abandoned, which is a continuation of Ser. No. 609,860, May 14, 1984, abandoned.

[30] Foreign Application Priority Data

May 16, 1983 [JP] Japan .................... 58-85363

[51] Int. Cl.⁵ .................. H01L 29/747; H01L 29/72; H01L 29/74; H01L 29/06
[52] U.S. Cl. ........................ 357/39; 357/36; 357/38; 357/86; 357/20
[58] Field of Search ............ 357/36, 38, 86, 20, 357/39

[56] References Cited

U.S. PATENT DOCUMENTS

| | | | |
|---|---|---|---|
| 2,929,006 | 3/1960 | Herlet | 357/36 |
| 3,252,063 | 5/1966 | Ziffer | 357/36 |
| 3,582,723 | 6/1971 | Kerr | 357/36 |
| 3,783,349 | 1/1974 | Beasom | 357/36 |
| 3,878,550 | 4/1975 | Benjamin | 357/36 |
| 4,441,116 | 4/1984 | Widcar | 357/36 |
| 4,618,781 | 10/1986 | Silber et al. | 357/36 |

FOREIGN PATENT DOCUMENTS

| | | |
|---|---|---|
| 0130508 | 9/1985 | European Pat. Off. |
| 56-33876 | 4/1981 | Japan ............ 357/36 |
| 57-100762 | 6/1982 | Japan ............ 357/36 |

OTHER PUBLICATIONS

International Rectifier Hexfet Databook, pp. 1, 6, ® 1981 Int. Rect. El Segundo, Calif.
Electronic Engineering, "Siliconix Undercuts Power Mosfet Ind," Feb. 1983, p. 15.
6029 Electronic Engineering, vol. 55, (1983), No. 674, London, Great Britain, p. 15, "Siliconix Undercuts Power MOSFET Industry".
Proceedings of the IEEE, Apr. 1968, pp. 742-744, "Mesh Emitter Transistor".
International Electron Devices Meeting 1983, Washington, D.C., Dec. 5-6-7, "A 900 MHz 100 W CW Mesh Emitter Type Transistor with P.H.S. Structure", pp. 225-228.
European Search Report, The Hague, 12/15/86, Examiner: D.L.D. Morvan.
K. Ishii et al., IEDM Technical Digest, "A 900 W CW Mesh Emitter Type Transistor with P.H.S. Structure," 1983, pp. 225-228.

*Primary Examiner*—Rolf Hille
*Assistant Examiner*—Wael Fahmy
*Attorney, Agent, or Firm*—Staas & Halsey

[57] ABSTRACT

A high frequency and high power semiconductor device comprising unit cells of the same shape, connected in parallel and fabricated on a chip. The thermal resistance of the chip is reduced by arranging the unit cells in a zigzag pattern. The zigzag arrangement of the unit cells is such that each unit cell in a line is offset by approximately one-half pitch from the unit cells in neighboring lines. As a result of the zigzag arrangement of the unit cells, the temperature of each unit cell is less influenced by heat from the unit cells in neighboring lines than are unit cells in an orthogonal matrix. In addition, the thermal distribution of the unit cells is improved to prevent hot spots. Using the zigzag arrangement, a single transistor can output over 100 watts C.W. at more than 900 MHz.

19 Claims, 9 Drawing Sheets

HIGH POWER FREQUENCY SEMICONDUCTOR DEVICE WITH IMPROVED THERMAL RESISTANCE

This is a continuation of co-pending application Ser. No. 134,604 filed on Dec. 14, 1987 which is a continuation of Ser. No. 860,682 filed on Apr. 30, 1986, which is a continuation of Ser. No. 609,860 filed on May 14, 1984 all abandoned.

BACKGROUND OF THE INVENTION

The present invention relates to an improvement in the thermal resistance of a semiconductor device which includes patterned unit cells arranged in a single chip. The present invention is particularly effective in reducing the junction temperature of a semiconductor device operating at a high frequency and having high power output.

As the operating frequency of a semiconductor device increases, the size of the device must decrease and the output power producable by the device also decreases. To provide a high power output, therefore, many small elemental devices (for example transistors) are conventionally arranged in parallel on a single chip. Typically, the small elemental devices are connected in parallel and arranged in a group called a unit cell, and several of the unit cells are connected in parallel on a single chip.

The elemental cell, unit cell, and the semiconductor device used in the description hereinafter are defined as follows The elemental cell is an elemental device such as a bipolar transistor or field effect transistor (FET) which is fabricated on a semiconductor substrate. In the high frequency and high power device described herein, elemental cells (usually more than ten) are combined into a unit cell. Further, such unit cells (usually more than ten unit cells) are combined into a single semiconductor device. In a single high frequency and high power transistor device, there are, usually more than one hundred (10×10) elemental cells.

For example, in a high frequency and high power bipolar transistor device, emitter regions are fabricated in a base region and these base regions are fabricated in a collector region. A junction between an emitter region and a base region corresponds to one elemental cell, each base region including a group of elemental cells (emitter regions) corresponds to a unit cell, and the collector region including the unit cells (base regions) corresponds to the semiconductor device (the transistor chip or die). Therefore, each base region is a common region for a unit cell, and the collector region is a common region for the semiconductor device (transistor chip). Further details of this structure will be described later with respect to FIGS. 9 and 10. In the following description, a bipolar transistor device will be considered to simplify the description of the present invention.

Elemental cells in a high frequency and high power semiconductor device must have the same pattern or shape. This requirement comes from the design objectives regarding the interconnecting circuit between the unit cells. When the device is operated at a high frequency and the shapes of the unit cells are not the same, it is very difficult to keep the unit cells from becoming unstable and resulting in low efficiency. Furthermore, it is essential that the length of the periphery of the emitter region be as long as possible to obtain a high current output, since the length of the emitter periphery determines the maximum emitter current.

In a high frequency high power device, a large amount of heat is generated in a small area, several mm$^2$ for example, during high power operation, causing the temperature of the device to increase dramatically. As a result, the junction temperature between the unit cells must be lowered and balanced to produce high power output in the high frequency region and to avoid thermal run away. Generally, a semiconductor device has a tendency to experience thermal run away due to a high junction temperature or an unbalanced junction temperature distribution. That is, the junction current tends to increase as the junction temperature goes up, and the increased current induces further increases in temperature. Once thermal run away occurs, the transistor characteristics degrade and lead to the possibility of catastrophic burn out.

In addition to preventing thermal runaway, lowering the junction temperature and balancing the temperature distribution also lead to improvements in the power output gain, the high frequency operating characteristics, and the life of the transistor chip. In a bipolar transistor, the heat produced in the transistor is primarily generated at the base-collector junction (usually called the base junction). As mentioned above, in a single unit cell, many small emitter regions are fabricated on the base region, and as long as all elemental cells are operated uniformly, heat is generated uniformly over the entire area of the base region. Accordingly, the temperature distribution of the base region is as illustrated in FIG. 1(a). In FIG. 1(a), reference numeral 50 refers to one of the contours of constant temperature for a unit cell 2. As depicted in FIG. 1(a), the temperature is highest at the center of the unit cell.

Thermal run away tends to occur in the center of the device, because the temperature at the center is usually the highest. This tendency is more noticeable when the area of the unit cell is large. If a high power semiconductor device has a structure consisting of a single unit cell having a large area, the amount of the heat generated by the device would be so high that the device would not be able to keep the thermal and electrical imbalance from resulting in thermal run away. Consequently, high power and high frequency semiconductor devices consist of uniformly distributed unit cells (base regions) 2, each covering a relatively small area.

A chip having high frequency and high power transistors is usually mounted on a heat sink. Most of the heat generated at the base junction flows from the base region of the unit cell 2. As a result, heat flow has flow-vector components both perpendicular and parallel to the base junction. The theoretical calculation of the heat flow and the temperature distribution can be made by solving Poission's equation. This is described in, for example: D. P. Kennedy "Spreading Resistance in Cylindrical Semiconductors" J. Appl. Phys. pp. 1490–1496, (1960). However, the calculation for an actual semiconductor device is very complicated and requires extended computation time on a high speed, large memory computer. As a consequence, a simple approximation using the concept of thermal spreading angle has been generally applied as a substitute for the complicated calculation. This approximation is also based on the solution of the Poission's equation, so that most of the heat flow is within an area included in the spreading angle determined by the boundary conditions of the device. Using the concept of the spreading angle, the heat flow of semiconductor devices will be explained hereinafter.

FIGS. 2, 3 and 4 are cross-sectional views of a semiconductor device illustrating heat flow in a substrate. A collector region (substrate) 1 abuts a base region (unit cell) 2 at a base junction 21. The heat generated at the base junction 21 flows to a heat sink 9 through the collector region 1 in a diverging pattern so that the heat flux (shaded area) spreads, creating a flux edge 3 at the plane of the heat sink 9. FIG. 2 illustrates the heat flow from the base junction 21 to the heat sink 9 without considering any heat flux influences from other unit cells and thereby corresponds to the temperature distribution on the chip surface illustrated in FIG. 1(a). As illustrated in FIG. 2, the heat flow through the collector region 1 diverges as indicated by the shaded region.

When a plurality of base regions 2 are arranged on the same collector region 1, heat interaction occurs between them. This interaction is illustrated in FIG. 3 in which the heat flow from each base region 2 interacts with that from other base regions 2 in a heat overlap zone 4. The larger the area of the overlap zone 4, the greater the thermal resistance of the collector region 1. This increase in thermal resistance raises the temperature of the unit cell 2 such that the contours of constant temperature 50 lose their symmetry as depicted in FIG. 1(b), resulting in unbalanced operation of the unit cells 2. In the prior art, based on the concept of the heat spreading angle, the base regions 2 are arranged to avoid large heat overlap zones 4, but at the same time, arranged as close as possible to each other to increase the packing density of the device and decrease the inductance and parasitic capacitance of the interconnecting circuit on the chip surface and the wirings, for high frequency operation.

The spreading angle ($\theta$) of the heat flow illustrated in FIG. 2 can be obtained experimentally by measuring the thermal resistance of a single unit cell 2 and generally has a value between 40 degrees and 60 degrees. The spreading angle $\theta$ is often applied to pattern pitch design of unit cells 2 in power transistors.

Because of prior art heat dissipation limitations, no prior art single chip bipolar transistor is rated for a continuous wave (C. W.) output power of more than 50 W at 900 MHz. This value has been viewed as a practical limit for high frequency and high power semiconductor single chip devices.

SUMMARY OF THE INVENTION

An object of the present invention, therefore, is to provide a semiconductor device with improved temperature distribution and thermal resistance.

Another object of the present invention is to extend the practical limit of the output power of high frequency and high power semiconductor devices.

Yet another object of the present invention is to increase the operating margin of high frequency and high power transistors.

Another object of the present invention is to increase the life of high frequency and high output transistors.

A further object of the present invention is to realize a bipolar transistor having an output power higher than the prior art transistor.

A still further object of the invention is to eliminate hot spots in a high frequency and high power transistor.

The above objects are accomplished by changing the arrangement of the unit cells on the substrate of the transistor chip. The arrangement of the unit cells is changed from the orthogonal arrangement of the prior art to an alternting or zigzag arrangement, so that the substrate has a smaller thermal resistance without decreasing the packing density. The output power of the high frequency and high power single transistor chip has thereby been increased up to approximately twice that of the prior art transistor.

These objects, together with other objects and advantages which will be subsequentally apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

As mentioned above, recent high frequency and high power transistors have a structure in which many emitter regions are fabricated on a common base region forming a unit cell 2, and many such unit cells 2 are fabricated on a common collector region 1. Such a structure is desirable for balancing the amount of current in each of the elemental cells and the unit cells to avoid thermal run away. To prevent thermal run away, the spacing between the unit cells should be fairly wide. However, wide spacing requires long interconnecting circuits on the surface of the chip and this increases the parasitic capacitance and inductance, hence the output power gain of the transistor is decreased. Therefore, the technique used for spacing the unit cells is very important in the design of high frequency and high power transistors.

Figure 2:
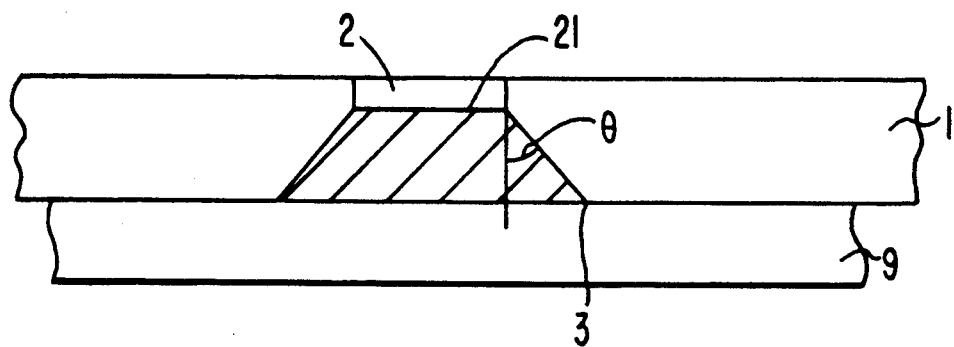
FIG. 2 is a cross-sectional view of a substrate illustrating heat flow from a unit cell to a heat sink.
Figure 3:
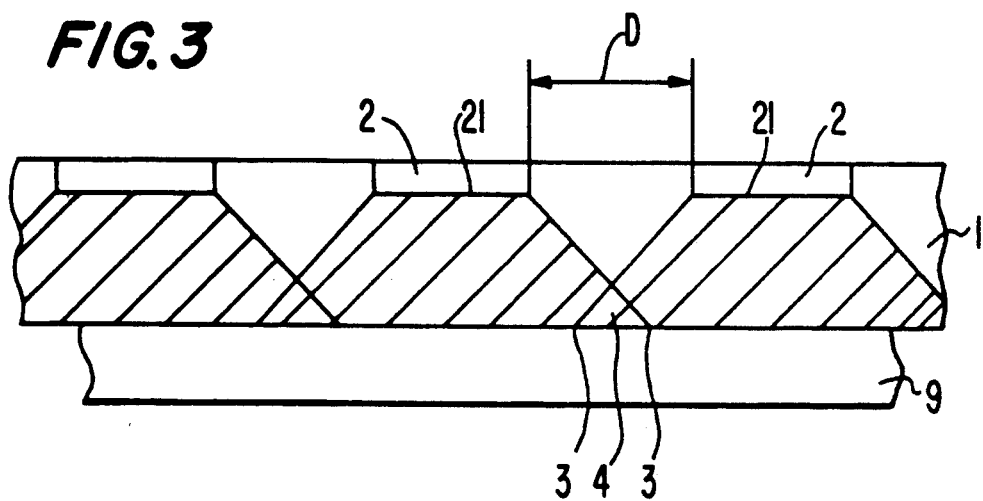
FIG. 3 is a cross-sectional view of a substrate illustrating heat flow from unit cells which are arranged so closely together that the heat flux from the unit cells overlap.
Figure 4:
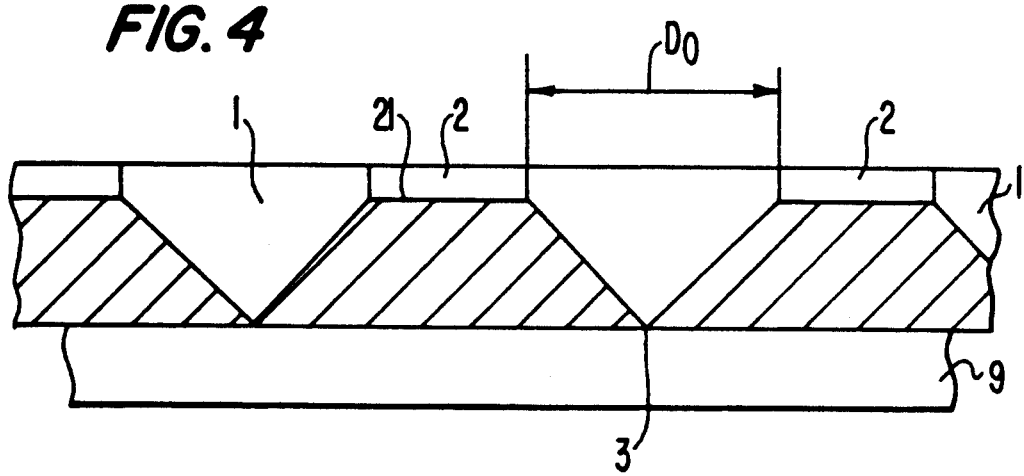
FIG. 4 is a cross-sectional view of a substrate illustrating the heat flow from unit cells properly separated.
Figure 5:
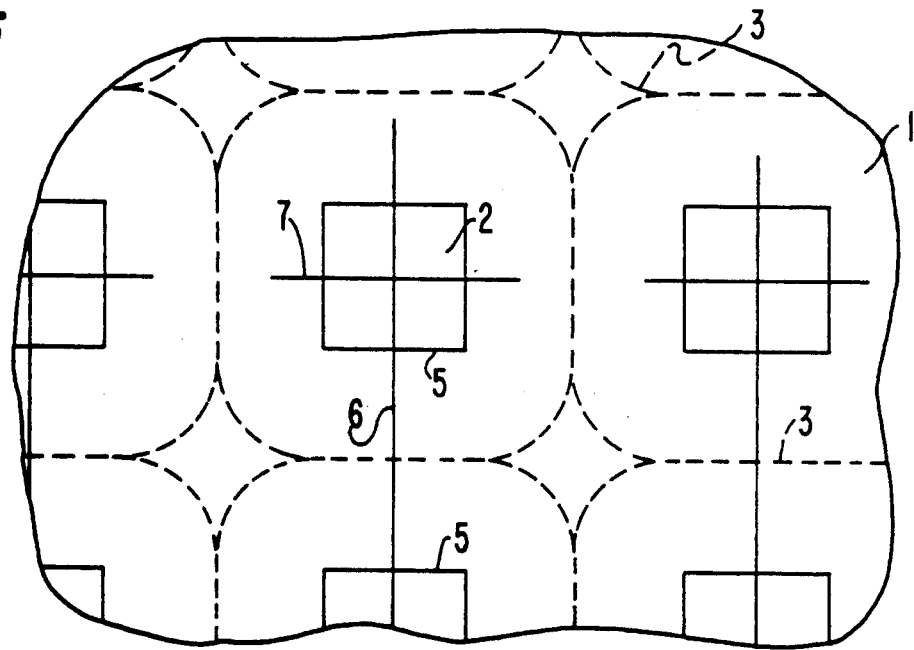
FIG. 5 is a plan view of an orthogonal arrangement of unit cells in prior art high frequency and high power transistors.

In the spacing technology of the prior art, the unit cells of a high frequency and high power transistor are arranged in the form of an orthogonal matrix as illustrated in FIG. 5. This matrix arrangement has been considered the best arrangement for high frequency operation because the capacitance and the inductance of the wiring pattern connecting the unit cells could be minimized, and furthermore has also been the best way to simplify the design of the unit cell and the wiring pattern. Therefore, the attention of designers has been primarily concentrated on how to decrease the space between the unit cells. As a result, the thermal flow problems previously described with respect to FIGS. 2, 3 and 4 have been widely studied.

Measurement of the temperature distribution on the surface of prior art chips, indicates that the temperature of unit cells is still being affected by heat flow from other unit cells, and some heat flux exists at a flow angle larger than the expected thermal spreading angle, becoming more apparent as the operating power rises. During the study of thermal distribution in a unit cell of a semiconductor device, the inventor found that, in the unit cell arrangement of the prior art illustrated in FIGS. 4 and 5, the temperature of some points on the unit cell rose quickly and sometimes produced a hot spot. It was determined that it is impossible to avoid hot spots during high power operation as long as the arrangement of the unit cells in FIG. 5 is used.

Figure 6:
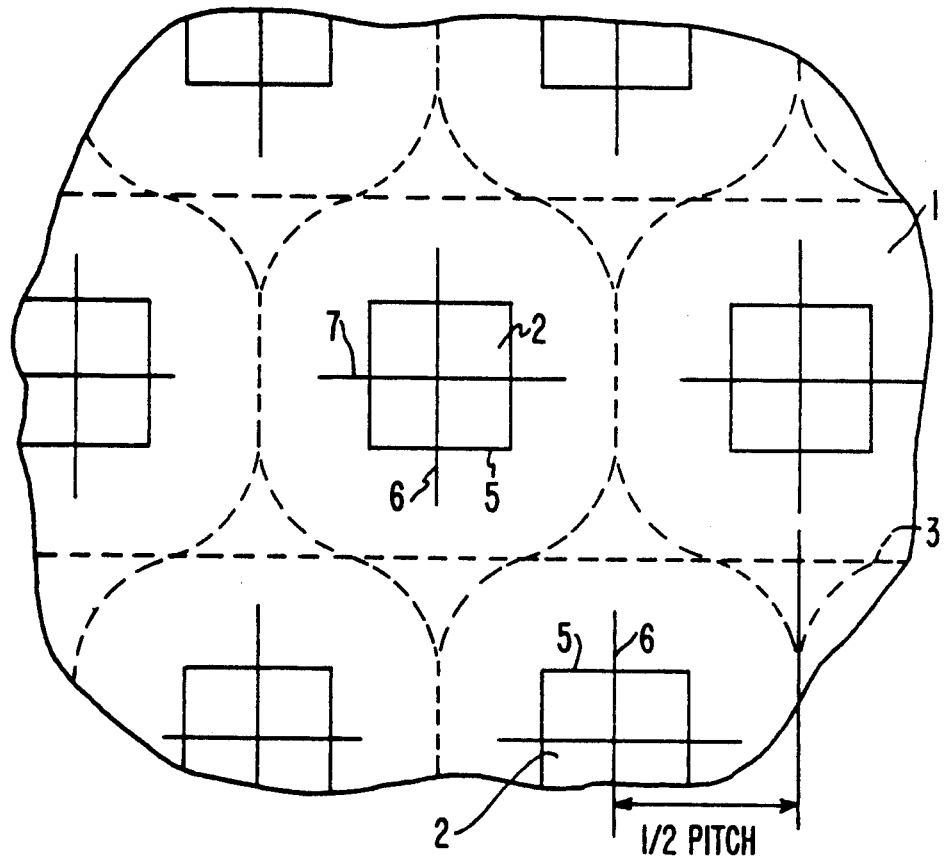
FIG. 6 is a plan view of an alternating or zigzag arrangement of unit cells for high frequency and high power transistors according to the present invention.

FIG. 6 is a plan view of a zigzag pattern of unit cells according to a first embodiment of the present invention which overcomes the problems inherent in the prior art pattern. Base patterns (unit cell patterns) 2 having base edges 5 are arranged in lines along line axes 7 on a collector region (substrate) 1. The broken line 3 indicates the edge of the heat flux on the side of the device adjacent to the heat sink 8 (FIG. 4). The center of the base edges 5 are bisected by alignment axes 6 which are perpendicular to the line axes 7. According to the present invention, the alignment axes 6 in one row are offset by one-half pitch or interval from the alignment axes 6 of the adjacent lines. This arrangement is called a "zigzag" or "alternating" pattern, as can be easily understood by comparing FIGS. 5 and 6.

Figure 1A:
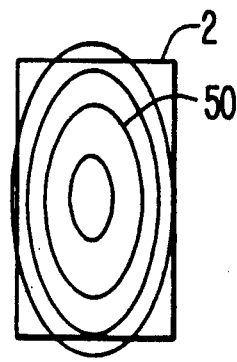
FIG. 1(a) depicts contours of constant temperature in the temperature distribution of a unit cell of a semiconductor device not affected by the temperature of other unit cells in the device.
Figure 1B:
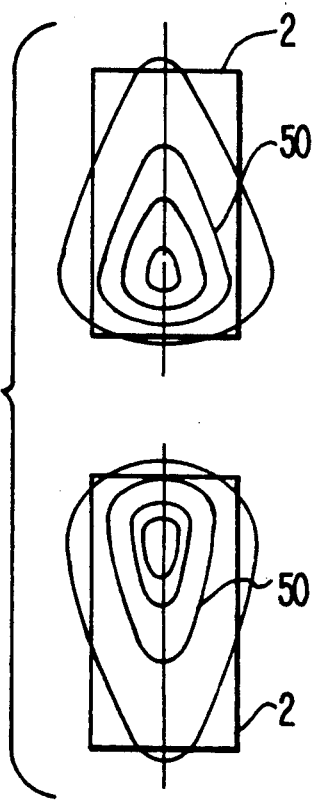
FIG. 1(b) depicts a temperature distribution for two unit cells which are affected by the heat flow from each other.
Figure 7:
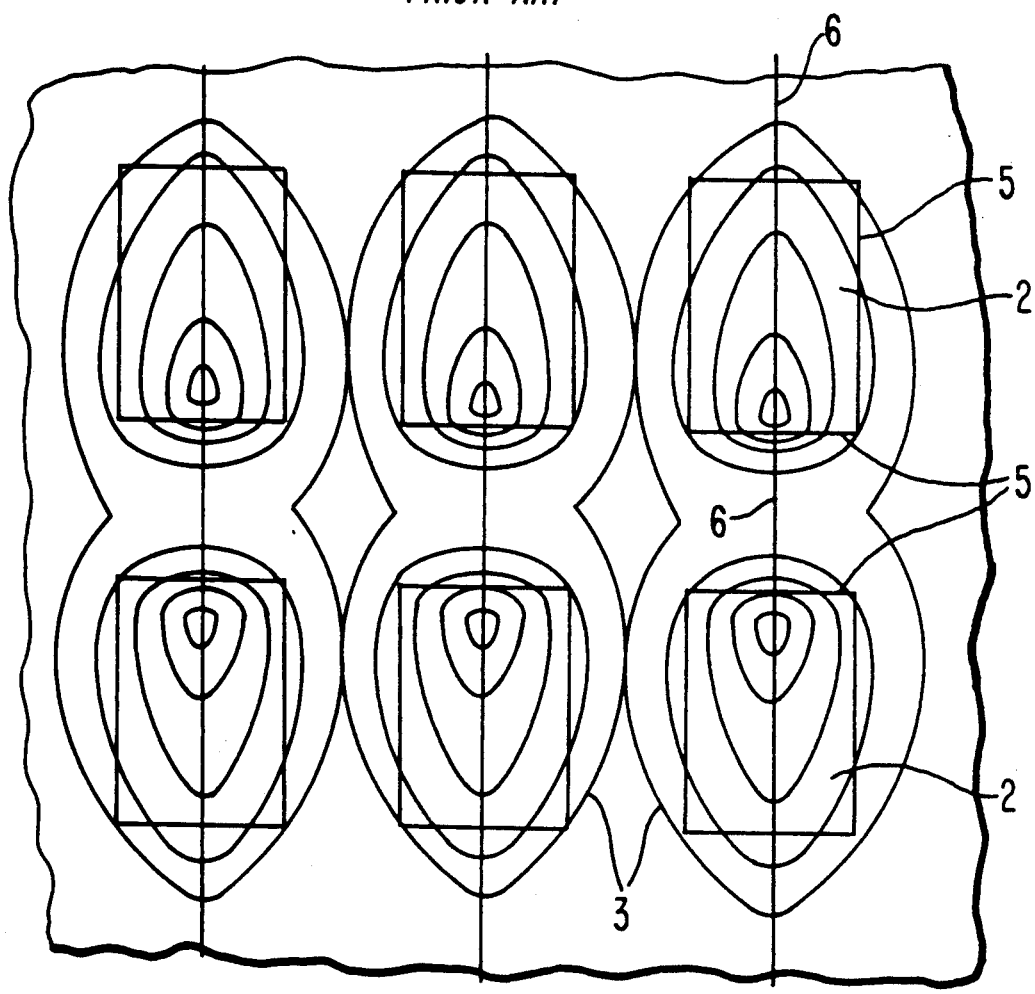
FIG. 7 depicts the contours of constant temperature on the surface of a prior art semiconductor device in which the unit cells are arranged in an orhtogonal matrix.
Figure 8:
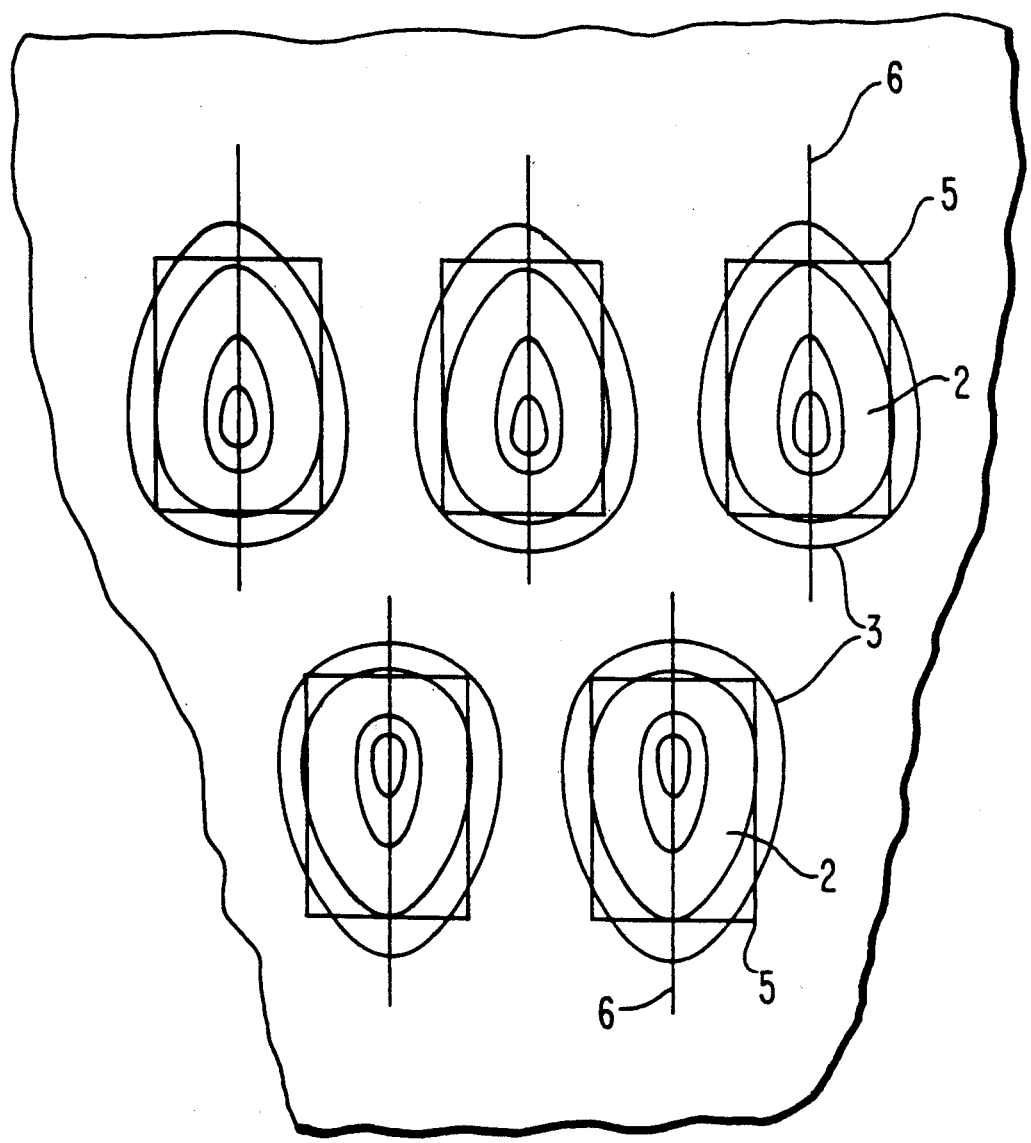
FIG. 8 depicts the contours of constant temperature on the surface of a semiconductor device in which the unit cells are arranged in an alternating arrangement according to the present invention.

The effect of the zigzag pattern on thermal distribution can be seen by comparing FIGS. 7 and 8 which illustrate the contours of constant temperature for FIGS. 5 and 6, respectively, where the contours were measured using an infrared microscope. The contours of constant temperature in FIG. 7 are greatly deformed as compared to those of a single unit cell 2 as depicted in FIG. 1(a) and the edge 3 of each heat flux pattern overlaps that of the neighboring patterns. This results in the temperature of each base region 2 being increased by the heat from neighboring base regions 2 and is likely to produce hot spots, therefore increased input power cannot be supplied to the transistor chip, and the chip cannot be rated for a higher output power.

The thermal distribution of the present invention is illustrated in FIG. 8. In FIG. 8, the unit cells 2 provide output at the same power level as in the case of FIG. 7, but the thermal distribution is greatly improved. That is, the outside edge 3 of the contours of constant temperature of neighboring unit cells 2 are separated from each other, and more input power can be supplied to the chip. That is, the power output can be increased until the outside edge 3 of the contours of constant temperature of each neighboring unit cell 2 make contact. The symmetry of the thermal distribution in each unit cell 2 indicates that the current flow in the unit cell 2 is well balanced. In both FIGS. 7 and 8, the pitch of the base pattern (unit pattern) 2 is the same, i.e., the packing densities of the devices are equal.

It appears that the zigzag pattern improves the temperature distribution of the unit cells 2 because heat flow from neighboring unit cells 2 with an angle wider than the expected thermal spreading angle is avoided. Since the heat flux density along the edge 5 of the unit cell 2 is largest at the center part of the base edge 5 when the shape of the unit cell 2 is a rectangle (as in FIGS. 6 and 8), the overlap zone of the heat flux can be reduced by sliding the alignment axes 6 of unit cells 2 in every other line by one-half pitch, so that the alignment axes 6 do not coincide with that of neighboring unit cells 2. This effect can be observed even for a transistor having a base pattern pitch longer than the length of the flux edge 3 calculated from the thermal spreading angle of the prior art.

If the transistor chip has more than three unit cells 2, a zigzag pattern of unit cells 2 can be formed so that the odd numbered lines 1, 3, 5, . . . and the even numbered lines 2, 4, 6, . . . are arranged in a zigzag or alternating pattern. When using the zigzag arrangement of the unit cells 2, other differences from the prior art result. The wiring pattern for the base regions 2 is stretched slightly (approximately one-half the length of the pitch for each line), however the resulting increase in parasitic capacitance and inductance is neglible compared to the prior art. The packing density of the zigzag pattern as compared to the prior art would decrease due to the jagged edge the base patterns 2 at the periphery of the collector 1, but since a chip is provided with a handling space or a monitoring space for the fabrication or testing of the transistor chip, this difference also is inconsequential.

Figure 9:
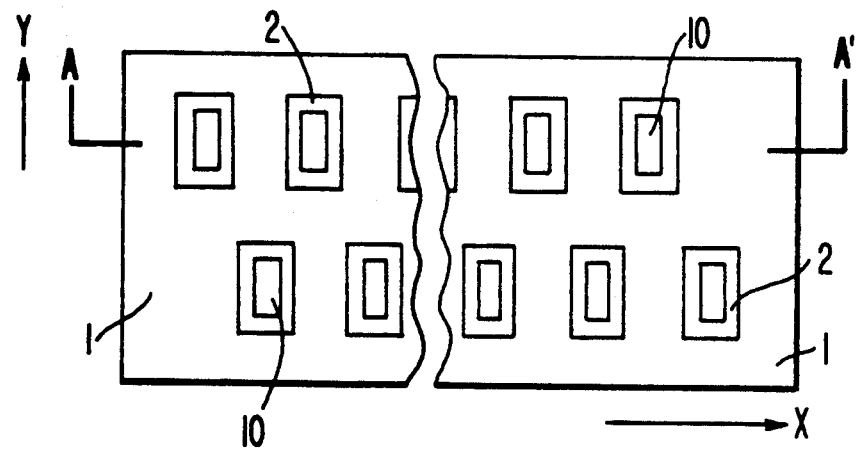
FIG. 9 is a plan view of a semiconductor device according to a first embodiment of the present invention illustrating a zigzag arrangement of square unit cells.

FIG. 9 is a plan view of a bipolar transistor chip having a zigzag base pattern, according to a preferred embodiment of the present invention, which produces C. W. output power of 50 watts (W) at 915 MHz. The bipolar transistor chip has 24 unit cells arranged in two lines, each line having 12 unit cells 2. The upper line in FIG. 9 will be called the first line and the lower line will be called the second line. The unit cells 2 of the first line are arranged one-half pitch to the left of the unit cells 2 of the second line, thus forming a zigzag pattern.

The common collector region 1 is a silicon epitaxial layer. The base regions (unit cells) 2 are fabricated in the collector region 1 of the silicon epitaxial layer 8 by a known diffusion method and have a conductivity type different from that of the collector region 1. An emitter region 10 is fabricated on the base region 2 using known diffusion fabrication methods and has the same conductivity type as the collector region 1. Each of the base regions 2 is 150 μm in a first dimension (width) measured along the line axes and 250 μm in length a second dimension (length) measured along the alignment axes. The first and second lines of the base regions (unit cells) 2 are each spaced from the outer edges of the collector region 1 by 100 μm in the Y-direction. The space between the left edge of the collector region 1 and the left edge of the left-most base region 2 is 100 μm in the first line and 225 μm in the second line because of the zigzag arrangement. Similarly, the space between the right edge of the collector region 1 and the right edge of the right-most base region 2 is 225 μm in the first line and 100 μm in the second line. The space between adjacent unit patterns in both the X and Y directions is 100 μm for a constant interval of 250 μm along each line axis and a spacing distance of 350 μm between axes.

Figure 10A:
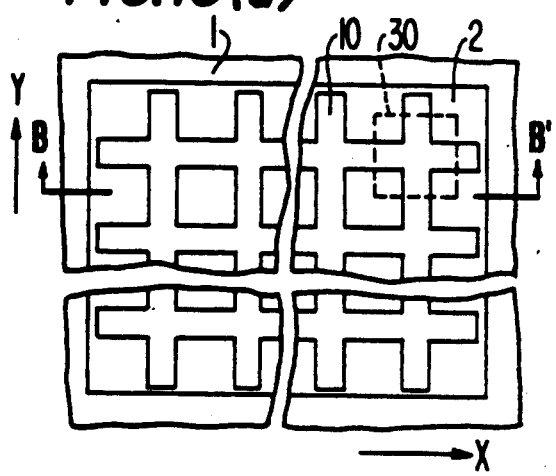
FIG. 10(a) is a plan view of a cell having a mesh type emitter applied to the unit cells in the embodiment of FIG. 9.
Figure 11A:
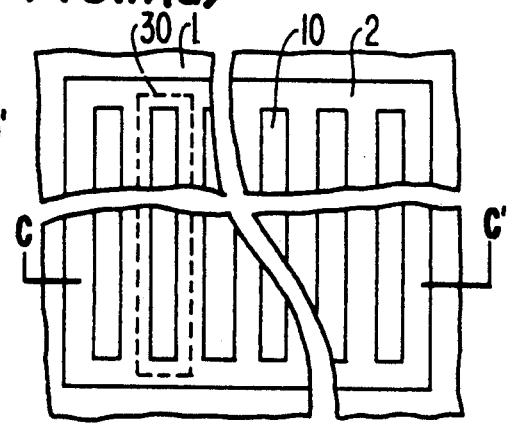
FIG. 11(a) is a plan view of a unit cell having a parallel rectangular type emitter applied to the unit cells in the embodiment of FIG. 9.
Figure 10B:
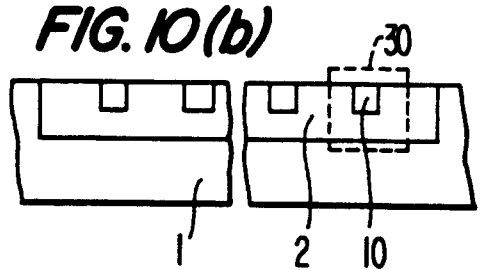
FIG. 10(b) is a cross-sectional view of the unit cell of FIG. 10(a) along the line of B—B'.
Figure 11B:
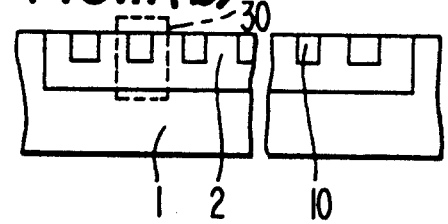
FIG. 11(b) is a cross-sectional view of the unit cell of FIG. 11(a) along the line C—C'.

The emitter region 10 is shaped as illustrated in FIG. 10(a), which is an enlarged plan view of one of the emitter regions 10 of FIG. 9. FIG. 10(b) is a cross-sectional view along the line B—B' in FIG. 10(a). This type of emitter region 10 is called a mesh emitter and is more efficient for a high frequency transistor than the parallel rectangular-type emitters illustrated in FIGS. 11(a) and 11(b) which respectively depict a plan view and a cross-sectional view along the line C—C'. An elemental cell 30 is enclosed by a broken line in FIGS. 10(a), 10(b), 11(a), and 11(b). The pitch of the lines of the mesh in FIG. 10(a) is 12 μm and 7 μm in the X and Y directions, respectively, and the width of the mesh is 1.5 μm. Thus, each unit cell 2 includes approximately 400 of the elemental cells 30. The details of a mesh emitter are further disclosed in M. Fukuta et al., Proc. IEEE (Letters) Vol. 56, p. 742, 1968.

Figure 12:
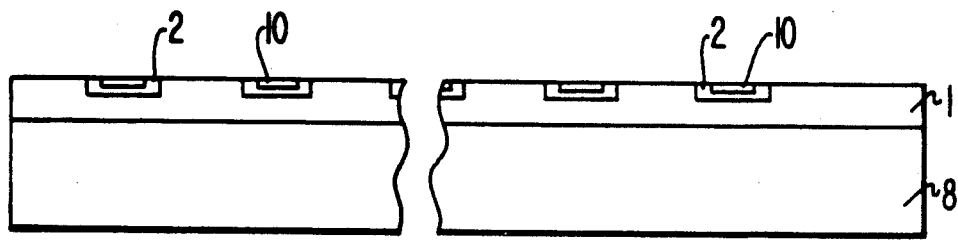
FIG. 12 is a cross-sectional view of the substrate along the line of A—A' in FIG. 9, illustrating the inner structure of the semiconductor device of the present invention.

FIG. 12 is a cross-sectional view along the line A—A' in FIG. 9. The thickness of the silicon substrate 8 is 30 μm, the thickness of collector region 1 is 10 μm, and the depth of base region 2 is 2,000 Angstroms. The surface passivation layer for the chip and the wiring patterns fabricated on the surface of the chip have been omitted from FIGS. 8 and 12 for the sake of simplicity and can be provided by those of ordinary skill in the art.

Figure 13:
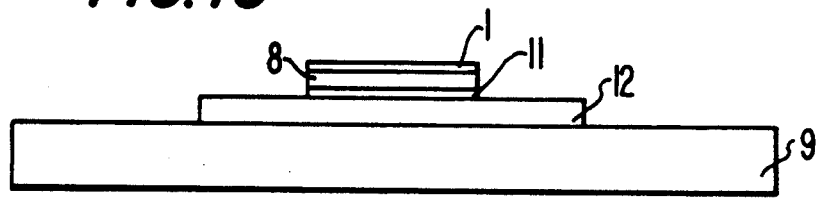
FIG. 13 is a cross-sectional view of the embodiment of the semiconductor device illustrated in FIG. 9, mounted on a heat sink.

FIG. 13 is a cross-sectional view of a bipolar transistor utilizing the chip described above. In FIG. 13, a silver ($A_g$) layer 11 about 20 μm thick solders the substrate 8 of the chip to a heat sink 12. The heat sink 12 is made of beryllium oxide ($B_eO$) and is 1,000 μthick, 7,000 μm wide and 4,000 μm long, and is larger than the silicon substrate 8 and collector region 1. A second heat sink 9 of copper (Cu) is 1,500 μm thick, 40,000 μm wide and 15,000 μm long, and is larger than the heat sink 12.

The high frequency and high power transistor disclosed above provides approximately 40% power efficiency producing 50 W output power at 915 MHz. The thermal resistance of the transistor chip is 1.0° C./W. On the other hand, the thermal resistance of the prior art transistor with an orthogonal matrix arrangement of the base patterns was 1.2° C./W. Therefore, the thermal resistance of the present invention is improved by 0.2° C./W. That corresponds to a decrease of the junction temperature of 15° C. resulting in a transistor chip that will operate more stably for a longer life, and can provide more output power if necessary. In other words, the 15° C reduction in junction temperature provides an operating margin which permits the transistor to be rated for a higher output power.

Figure 14:
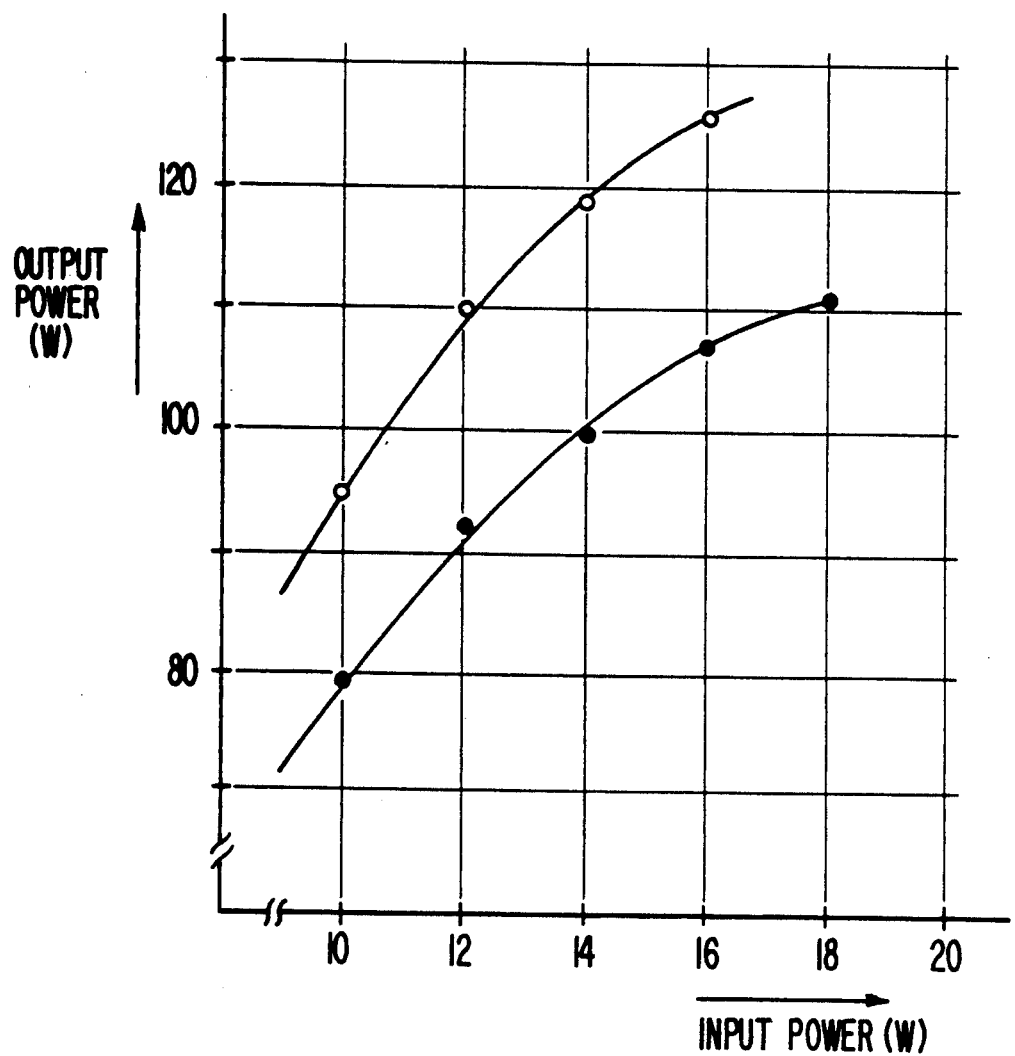
FIG. 14 is a graph of C. W. output power versus input power at a frequency of 900 MHz, comparing a transistor according to the present invention with that of the prior art.

The relationship between output power and input power of high power transistors operating at 915 MHz C. W. (continuous wave) is depicted in FIG. 14 for a prior art transistor and for the first embodiment of the present invention. The curve through the solid black dots corresponds to the output power of a transistor having a unit cell arrangement according to the prior art, while the curve through the circles corresponds to the output power of a transistor having a unit cell arrangement according to the first embodiment of the present invention. Both transistors are the mesh emitter type, have the same chip size (1.5 mm × 4.75 mm) and the same pattern shape of the emitter and base regions, i.e., they only differ in their arrangement. Namely, the solid black dots represent an orthogonal matrix of unit cells (base regions) 2 according to the prior art, and the circles represent a zigzag arrangement according to the present invention.

It is clear from FIG. 14 that the prior art transistor cannot provide a guaranteed output value of 100 W, because it needs an operating margin to be reliable. The transistor according to the present invention, however, easily overcomes the 100 W output barrier. The inventor believes that this is the highest output power attained by a single chip transistor at 915 MHz at the present time.

Figure 15:
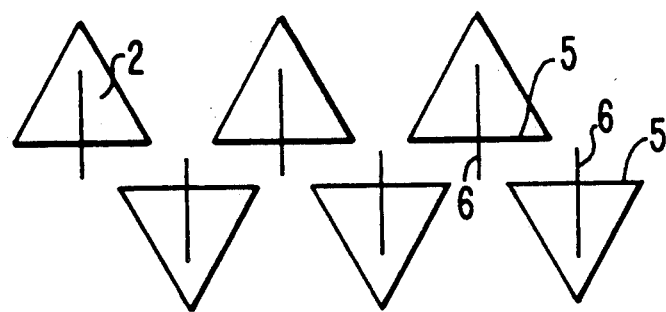
FIG. 15 is a plan view of a second embodiment of the present invention using triangular unit cells.
Figure 16:
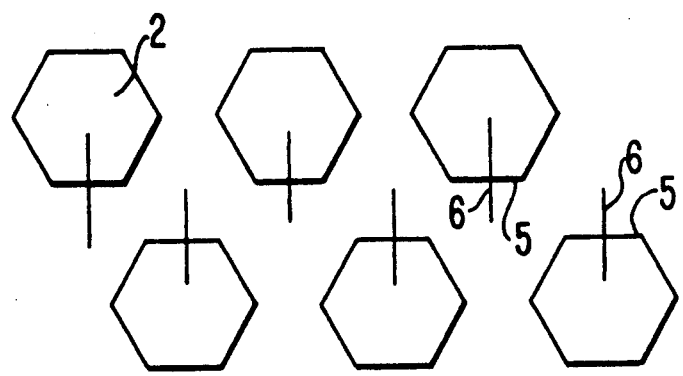
FIG. 16 is a plan view of a third embodiment of the present invention using hexagonal unit cells.

The present invention can be applied to an arrangement of unit cells 2 of any shape. An example related to the present invention is disclosed in S. Kashiwagi et al., International Electron Devices Meeting Technical Digest 83-225, IEEE, Dec. 5-7, 1983. Another example is illustrated in FIG. 15, where triangular unit cells 2 are arranged in two lines on a chip, with each triangle having a side facing a triangle in the other line. The thermal resistance of the chip is improved by using a zigzag arrangement of the unit cells 2. When each unit cell 2 is a hexagon, the zigzag arrangement of the unit cells 2 as illustrated in FIG. 16 is also very effective in reducing the thermal resistance in the transistor chip.

The above embodiments have described a bipolar transistor, in particular, a mesh emitter type transistor, however, it should be understood that the effect of the zigzag arrangement of the unit cells 2 can be applied to any type of bipolar transistor such as a parallel rectangular emitter type transistor. It should be clear that the present invention requires no change in conventional semiconductor manufacturing processes, and can be applied to any kind of process for fabricating a semiconductor device, such as a field effect type transistor (FET), to improve the thermal dissipation of the device. In addition, the material used for the device is not limited to silicon, but any other semiconductor material, such as gallium arsenide, can be used.

The many features and advantages of the present invention are apparent from the detailed specification, and thus it is intended by the appended claims to cover all such features and advantages which fall within the true spirit and scope of the invention. Further, since numerous modifications and changes will readily occur to those skilled in the art, it is not desired to limit the invention to the exact construction and operation illustrated and described, accordingly, all suitable modifications and equivalents may be resorted to, falling within the scope and spirit of the invention.

What is claimed is:

1. A high power and high frequency semiconductor device forming a bipolar transistor, comprising:
   a semiconductor substrate; and
   unit cells, operatively connected in parallel and formed in a zigzag pattern in said semiconductor substrate, said unit cells forming base regions of said bipolar transistor and each of said unit cells comprising elemental cells operatively connected in parallel in a substantially identical pattern to form a shape which is substantially identical for each of said unit cells, said elemental cells corresponding to emitter regions of said bipolar transistor.

2. A semiconductor device as recited in claim 1, wherein said unit cells are arranged in at east two lines, each line having a line axis and each unit cell having an alignment axis perpendicular to the line axis, the alignment axes of said unit cells in adjacent lines being offset by one-half pitch.

3. A semiconductor device as recited in claim 2, wherein the shape of each of said unit cell is one of square, a rectangle, a triangle, a hexagon and an octogon.

4. A semiconductor device as recited in claim 2,
   wherein the shape of each of said unit cells is a rectangle having a length of 250 $\mu$m and a width of 150 $\mu$m, and
   wherein said unit cells are separated by 100 $\mu$m along the line axis and between adjacent lines of said unit cells.

5. A semiconductor device as recited in claim 2, wherein said unit cells comprise elemental cells, operatively connected in parallel and formed in said unit cells in a substantially identical pattern.

6. A semiconductor device as recited in claim 1, wherein the emitter regions are formed by a mesh emitter.

7. A semiconductor device as recited in claim 1, further comprising a heat sink mounted on said semiconductor substrate.

8. A semiconductor device as recited in claim 1, wherein the shape of said unit cells is a polygon.

9. A high power and high frequency semiconductor device, comprising:
   a semiconductor substrate;
   a first unit cell line comprising first unit cells formed in said semiconductor substrate at a constant pitch along said first unit cell line; and
   a second unit cell line parallel to said first unit cell line, comprising second unit cells formed in said semiconductor substrate at the constant pitch along said second unit cell line and offset by one-half of the constant pitch from said first unit cells, said first and second unit cells operatively connected in parallel and each of said first and second unit cells comprising elemental cells operatively connected in parallel in a substantially identical pattern to form a shape which is substantially identical for each of said first and second unit cells.

10. A high power and high frequency semiconductor device as recited in claim 9,
    wherein the first and second unit cell lines are arranged along substantially parallel line axes separated by a spacing distance, and
    wherein the shape of said first and second unit cells has a maximum first dimension, measured along one of the line axes of the first and second unit cell lines, approximately three-fifths of the constant pitch and a maximum second dimension, measured along alignment axes perpendicular to the line axes, approximately five-sevenths of the spacing distance.

11. A high power and high frequency semiconductor device forming a bipolar transistor, comprising:
    a semiconductor substrate;
    a common collector region formed on a surface of said semiconductor substrate, said common collector region having a first conductivity type;
    a plurality of base inland regions, operatively connected in parallel, having a second conductivity type different from the first conductivity type, each of said base inland regions being formed with a polygon shape on the surface of said semiconductor substrate in said common collector region, said base inland regions begin arrange din first and second groups, said base inland regions in the first group being formed along a first group line at a constant pitch of 250 micrometers, said base inland regions in the second group being formed at the same constant pitch along a second group line substantially parallel to the first group line at a distance of 350 micrometers therefrom, each of said base inland regions having a width of 150 micrometers measured parallel to the first group line nd a length of 250 micrometers measured perpendicular to the first group line, said base inland regions in the first group having first sides facing the second group with first alignment axes bisecting the first sides, said base inland regions in the second group have second sides facing the first group with second alignment axes bisecting the second sides, the first and second alignment axes being offset with respect to each other by 125 micrometers; and
    a plurality of emitter regions, operatively connected in parallel, having the first conductivity type, at least one of said emitter regions being formed in each of said base inland regions, each of said emitter regions having a substantially identical pattern.

12. A semiconductor device as recited in claim 11, wherein the polygon shape of each of said base inland regions is one of a rectangle, a triangle, a hexagon and an octagon.

13. A semiconductor device as recited in claim 11, wherein each of said emitter regions comprises a mesh emitter.

14. A high power and high frequency semiconductor device forming a bipolar transistor, comprising:
    a common collector region having a first conductivity type;
    a plurality of base regions, having a second conductivity type opposite to the first conductivity type, formed separately on a surface of said common collector region with a constant pitch along parallel row-lines, the rowlines being equally spaced apart by a separation distance, each of said base regions having a closed boundary surrounded by said common collector region, said base regions on even-numbered row-lines being offset along the row-lines by one-half of the constant pitch with reference to said base regions on odd-numbered row-lines, the separation distance and the constant pitch being selected to reduce thermal resistance of the bipolar transistor during operation; and emitter regions having the first conductivity type and formed in each of said base regions.

15. A high power and high frequency semiconductor device according to claim 14, wherein each of said base regions has a polygon shape with at least one side of said polygon shape parallel to the row-lines.

16. A high power and high frequency semiconductor device according to claim 15, wherein the polygon shape is one of a rectangular, a square, and a hexagon.

17. A high power and high frequency semiconductor device according to claim 16, wherein the polygon shape is a rectangle with first and second sides perpendicular to the row-lines, 250 micrometers long and third and fourth side parallel to the row-lines, 150 micrometers long, and wherein the constant pitch is 250 micrometers and the separation distance is 350 micrometers.

18. A high power and high frequency semiconductor device forming a bipolar transistor, comprising:
 a semiconductor substrate;
 a common collector region formed on a surface of said semiconductor substrate, said common collector region having a first conductivity type;
 a plurality of base inland regions, operatively connected in parallel, having a second conductivity type different from the first conductivity type, each of said base inland regions being formed with a polygon shape on the surface of said semiconductor substrate in said common collector region, said base inland regions being arranged in first and second groups, said base inland regions in the first group being formed along a first group line at a constant pitch, said base inland regions in the second group being formed at the same constant pitch along a second group line substantially parallel to the first group line at a predetermined distance therefrom, said base inland regions in the first group having first sides facing the second group with first alignment axes bisecting the first sides, said base inland regions in the second group having second sides facing the first group with second alignment axes bisecting the second sides, the first and second alignment axes being offset with respect to each other; and
 a plurality of emitter regions, operatively connected in parallel, having the first conductivity type, at least one of said emitter regions being formed in each of said base inland regions, each of said emitter regions having a substantially identical pattern.

19. A semiconductor device as recited in claim 18, wherein each of said emitter regions comprises a mesh emitter.

* * * * *

UNITED STATES PATENT AND TRADEMARK OFFICE
CERTIFICATE OF CORRECTION

PATENT NO. : 5,003,370

DATED : March 26, 1991

INVENTOR(S) : Kashiwagi

It is certified that error appears in the above-identified patent and that said Letters Patent is hereby corrected as shown below:

Title Page [54], "HIGH POWER FREQUENCY" should be --HIGH POWER HIGH FREQUENCY--;

[56], line 8, "Widcar" should be --Widlar--;

OTHER PUBLICATIONS, line 2, delete " R ";
line 3, "1981" should be --Copyright 1981--.

Col. 1,   line 1, "HIGH POWER FREQUENCY" should be --HIGH POWER HIGH FREQUENCY--.

Col. 7,   line 10, delete "length";
line 54, "1,000 µthick," should be --1,000µm thick--.

Col. 9,   line 18, "east" should be --least--.

Col. 10,  line 22, "arrange din" should be --arranged in--.
line 61, "rowlines" should be --row-lines--.

Signed and Sealed this

Twenty-fifth Day of August, 1992

Attest:

DOUGLAS B. COMER

*Attesting Officer*     *Acting Commissioner of Patents and Trademarks*